United States Patent
Xiang et al.

(10) Patent No.: US 6,746,944 B1
(45) Date of Patent: Jun. 8, 2004

(54) LOW NISI/SI INTERFACE CONTACT RESISTANCE WITH PREAMORPHIZING AND LASER THERMAL ANNEALING

(75) Inventors: Qi Xiang, San Jose, CA (US); Robert B. Ogle, San Jose, CA (US); Eric N. Paton, Morgan Hill, CA (US); Cyrus E. Tabery, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/341,345

(22) Filed: Jan. 14, 2003

(51) Int. Cl.[7] ............... H01L 21/3205; H01L 21/4763; H01L 21/44; H01L 21/336
(52) U.S. Cl. .................. 438/592; 438/685; 438/301
(58) Field of Search ............... 438/592, 301, 438/685, 527, 303, 302

(56) References Cited

U.S. PATENT DOCUMENTS

| | | | | |
|---|---|---|---|---|
| 6,037,640 A | * | 3/2000 | Lee | 257/408 |
| 6,268,640 B1 | * | 7/2001 | Park et al. | 438/303 |
| 6,319,798 B1 | * | 11/2001 | Yu | 438/527 |
| 6,372,591 B1 | * | 4/2002 | Mineji et al. | 438/305 |
| 6,436,747 B1 | * | 8/2002 | Segawa et al. | 438/197 |
| 6,534,390 B1 | * | 3/2003 | Chong et al. | 438/592 |
| 6,537,886 B2 | * | 3/2003 | Lee | 438/306 |
| 6,551,885 B1 | * | 4/2003 | Yu | 438/300 |
| 6,620,671 B1 | * | 9/2003 | Wang et al. | 438/226 |
| 6,638,861 B1 | * | 10/2003 | Ngo et al. | 438/685 |
| 6,642,119 B1 | * | 11/2003 | Pelella et al. | 438/303 |
| 6,642,122 B1 | * | 11/2003 | Yu | 438/372 |

* cited by examiner

*Primary Examiner*—John F. Niebling
*Assistant Examiner*—Walter L. Lindsay, Jr.

(57) ABSTRACT

Semiconductor devices with reduced NiSi/Si interface contact resistance are fabricated by forming preamorphized regions in a substrate at a depth overlapping the subsequently formed NiSi/Si interface, ion implanting impurities to form deep source/drain implants overlapping the preamorphized regions deeper in the substrate and laser thermal annealing to activate the deep source/drain regions. Nickel silicide layers are then formed in a main surface of the substrate and on the gate electrode. Embodiments include forming deep source/drain regions with an activated impurity concentration of $1 \times 10^{20}$ to $1 \times 10^{21}$ atoms/cm$^3$ at the NiSi/Si interface.

7 Claims, 3 Drawing Sheets

LOW NISI/SI INTERFACE CONTACT RESISTANCE WITH PREAMORPHIZING AND LASER THERMAL ANNEALING

FIELD OF THE INVENTION

The present invention relates to the fabrication of miniaturized high speed semiconductor devices, particularly to self-aligned silicide (salicide) technology. The present invention is particularly applicable to fabricating high speed miniaturized semiconductor devices with nickel silicide layers for reduced contact resistance.

BACKGROUND ART

As integrated circuit geometries continue to plunge into the deep submicron regime, it becomes increasingly more difficult to accurately form discreet devices on a semiconductor substrate exhibiting the requisite reliability and circuit operating speed. High performance microprocessor applications require rapid speed of semiconductor circuitry. The speed of semiconductor circuitry varies inversely with the resistance (R) and capacitance (C) of the interconnection system. The higher the value of the RxC product, the more limiting the circuit operating speed. Miniaturization requires long interconnects having small contacts and small cross sections. Accordingly, continuing reduction in design rules into the deep submicron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particularly advantages vis-à-vis other metals in salicide technology. Nickel requires a lower thermal budget in that nickel silicide and can be formed in a single heating step at a relatively low temperature of about 250° C. to about 600° C. with an attendant reduction in consumption of silicon in the substrate, thereby enabling the formation of ultra-shallow source/drain junctions.

As miniaturization continues to plunge into the deep submicron regime, various issues arise in implementing salicide technology, including the formation of nickel silicide contacts. During silicidation, dopant deactivation occurs at the interface between the nickel silicide layers and silicon substrate. This reduction in dopant concentration is manifested by an increase in resistivity and, hence, contact resistance at the nickel silicide/silicon (NiSi/Si) interface.

Accordingly, there exists a need for salicide methodology enabling the formation of nickel silicide interconnection systems with reduced NiSi/Si contact resistance.

DISCLOSURE OF THE INVENTION

An advantage of the present invention is a method of manufacturing a semiconductor device having nickel silicide contacts with reduced NiSi/Si interface contact resistance.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a gate electrode, having an upper surface and side surfaces, over a main surface of a silicon substrate with a gate dielectric layer therebetween; forming shallow source/drain extensions in the substrate; forming dielectric sidewall spacers on the side surfaces of the gate electrodes; forming preamorphized regions in the substrate at a first depth overlapping an interface between the silicon substrate and subsequently formed nickel silicide layers in the main surface of the silicon substrate; ion implanting impurities to form deep source/drain implants in the substrate at a second depth overlapping the preamorphized regions; laser thermal annealing to activate deep source/drain regions; and forming nickel silicide layers in the main surface of the substrate with the interface therebetween and forming a nickel silicide layer in the upper surface of the gate electrode.

Embodiments of the present invention include ion implanting to form the deep source/drain implants at a depth from the main surface of the substrate deeper than the preamorphized regions, as by forming the preamorphized regions at a depth of 200 Å to 400 Å and forming the deep source/drain implants at a depth of 800 Å to 1,500 Å. Upon laser thermal annealing, as by impinging a pulsed laser light beam at a radiant fluence of 0.2 to 0.8 joules/cm$^2$ for 1 to 10 nanoseconds, the dopant supersaturated preamorphized regions are crystallized at a high impurity concentration and the deep source/drain regions activated. Nickel silicidation is then implemented by depositing a layer of nickel and heating to form nickel silicide layers on the main surface of the silicon substrate and on the gate electrode.

Additional advantages of the present invention will be readily apparent to those skilled in the art from the following detailed description wherein the embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 5, similar features and elements are denoted by similar reference characters.

DESCRIPTION OF THE INVENTION

The present invention addresses and solves the problem of dopant deactivation at NiSi/Si interfaces, which dopant deactivation causes an increase in contact resistance at the interface. In accordance with embodiments of the present invention, preamorphized regions are formed in the substrate at the interface between the silicon substrate and the subsequently formed nickel silicide layers. Ion implantation is then conducted to form deep source/drain implants. Laser thermal annealing is then implemented during which the substrate temperature is rapidly elevated to 1,100° C. to 1,250° C. and quickly quenched such that the high supersaturated impurity concentration in the preamorphized region is basically frozen resulting in the formation of deep source/drain regions having a high impurity concentration at the NiSi/Si interface, thereby reducing contact resistance and, hence, increasing operating speed.

An embodiment of the present invention is schematically illustrated in FIGS. 1 through 5. Adverting to FIG. 1, a gate electrode 10, such as doped polycrystalline silicon, is formed over a substrate 11, such as doped monocrystalline silicon, with a gate dielectric layer 12 therebetween, such as silicon oxide at a thickness of 5 Å to 20 Å. Ion implantation followed by rapid thermal annealing is then conducted to form shallow source/drain extensions 13, typically extending into the substrate to a depth of 80 Å to 200 Å and having an impurity concentration of $5\times10^{17}$ to $5\times10^{19}$ atoms/cm³.

Figure 1:
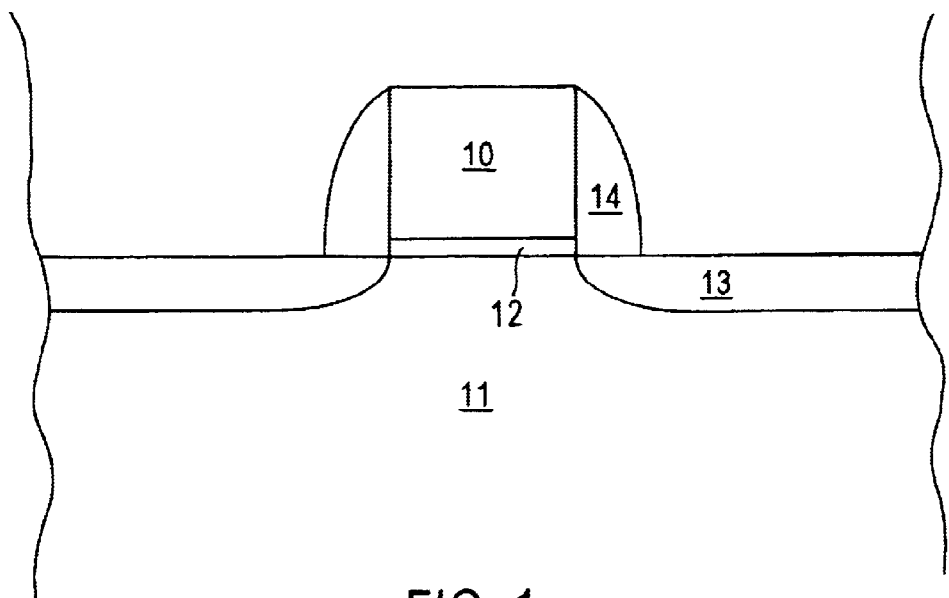
FIGS. 1 through 5 schematically illustrated sequential phases of a method in accordance with an embodiment of the present invention.
Figure 2:
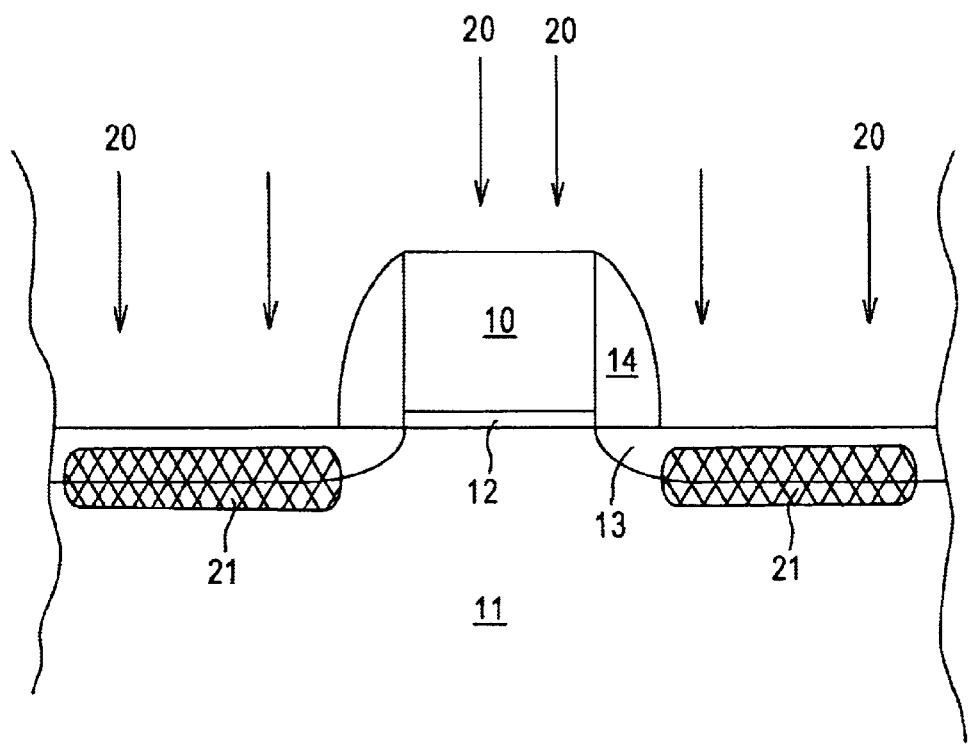

Subsequently, as illustrated in FIG. 2, ion implantation is conducted, as illustrated by arrows 20, to form preamorphized regions 21 in the substrate. Preamorphizing implantation conditions are selected such that preamorphized regions 21 are formed overlapping the interface between silicon substrate 11 and a nickel silicide layer subsequently formed on the main surface of the silicon substrate 11. For example, preamorphized regions 21 may be formed such that they. extend to a depth of 200 Å to 400 Å on the main surface of substrate 11. Preamorphized regions 21 may be formed by ion implanting an element, such as silicon (Si), germanium (Ge) or xenon (Xe). For example, Xe can be implanted at an implantation dosage of $1\times10^{14}$ to $5\times10^{14}$ ions/cm² at an implantation energy of 50 to 150 KeV.

Figure 3:
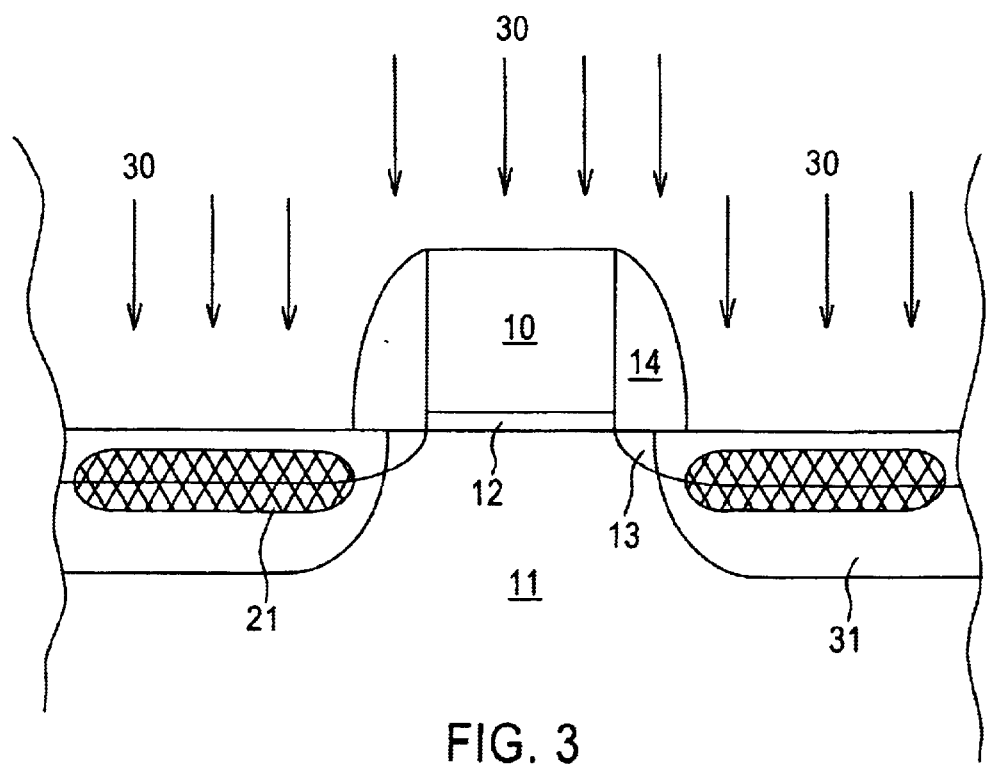

Ion implantation is then implemented, as illustrated by arrows 30 in FIG. 3, to form deep source/drain implants 31 which overlap preamorphized regions 21 and extend deeper into the substrate, such as to a depth of 800 Å to 1500 Å. Deep source/drain implants 31 may be formed by ion implantation at an implantation dosage of $2\times10^{14}$ to $2\times10^{15}$ ions/cm² at an implantation energy of 5 to 50 KeV, depending on the implantation species. During ion implantation, preamorphized regions 21 are supersaturated with impurities.

Figure 4:
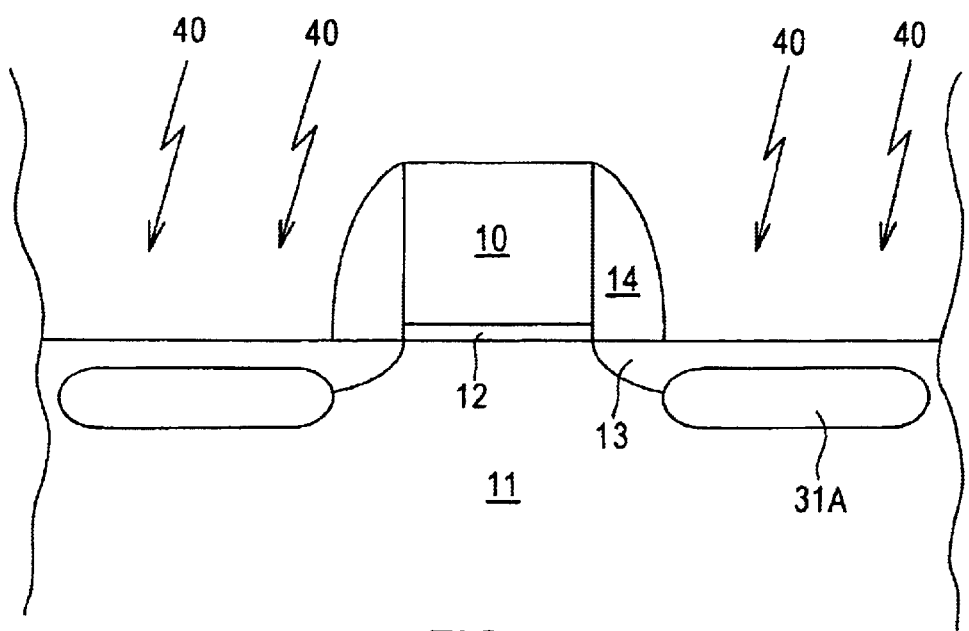
Figure 5:
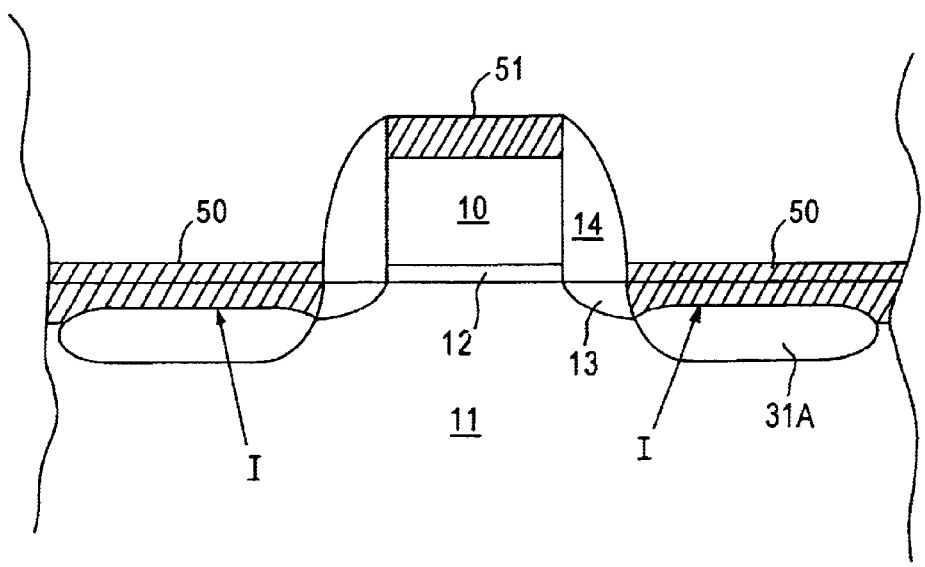

Adverting to FIG. 4, laser thermal annealing is then implemented, as illustrated by arrows 40, to crystallize preamorphized regions 21 and activate deep source/drain regions 31A. During laser thermal annealing, which may be implemented by impinging a pulsed laser light beam at a radiant fluence of 0.2 to 0.8 Joules/cm² for 1 to 10 nanoseconds, the substrate is elevated to a temperature of 1,100° C. to 1,250° C. and rapidly quenched, thereby preserving the high dopant impurity concentration of the preamorphized regions.

Subsequently, nickel silicidation is implemented, as by depositing a layer of nickel, as at a thickness of about 100 Å to about 300 Å, e.g., about 200 Å, followed by rapid thermal annealing as at a temperature of about 250° C. to about 600° C., e.g., about 400° C. to about 600° C., thereby forming nickel silicide layers on the main surface of silicon substrate 11 and nickel silicide layer 51 on the upper surface of the gate electrode 10. The interface 1 formed between nickel silicide layer 50 and deep source/drain region 31A has a high activated impurity concentration, such as an activated impurity concentration of $1\times10^{18}$ to $1\times10^{21}$ atoms/cm³ by virtue of the combined preamorphizing and laser thermal annealing treatments. For example, the activated impurity concentration of the deep source/drain regions 31A may decrease to a level of $5\times10^{18}$ to $5\times10^{19}$ at a lower portion thereof. Unreacted nickel is then removed from the silicon nitride sidewall spacers 14 in a conventional manner, as by treating with a mixture of sulfuric acid and hydrogen peroxide with a ratio of sulfuric acid: hydrogen peroxide of about 1:12 to about 1:4, e.g., about 1:2.

The strategic formation of preamorphized regions at the subsequently formed NiSi/Si interface coupled with laser thermal annealing enables the formation of a NiSi/Si interface having a very high impurity concentration, thereby significantly reducing contact resistance and improving operating speed. The present invention enjoys industrial applicability in fabricating various types of highly miniaturized semiconductor devices with improved reliability and high operating speed. The present invention has particular applicability in fabricating semiconductor device with design features in the deep submicron regime, as with a design rule of about 0.12 micron and under, with significant improved reliability and improved manufacturing throughput.

In the preceding detailed description, the present invention is described with reference to specific exemplary embodiments thereof It will, however, be evident that various modifications and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a gate electrode, having an upper surface and side surfaces over a main surface of a silicon substrate with a gate dielectric layer therebetween;

forming shallow source/drain extensions in the substrate;

forming dielectric sidewall spacers on the side surfaces of the gate electrode;

forming preamorphized regions in the substrate at a first depth overlapping an interface between the silicon substrate and subsequently formed nickel silicide layers in the main surface of the silicon substrate;

ion implanting impurities to form deep source/drain implants in the substrate at a second depth overlapping the preamorphized regions;

laser thermal annealing to activate deep source/drain regions; and forming nickel silicide layers in the main surface of the substrate with the interface therebetween, and forming a layer of nickel silicide on the upper surface of the gate electrode.

2. The method according to claim 1, comprising ion implanting to form the deep source/drain implants at the second depth greater than the first depth.

3. The method according to claim 2, comprising:

forming the preamorphized regions at the first depth at of 200 Å to 400 Å from the main surface of the silicon substrate; and ion implanting to form the deep source/drain implants at the second depth of 800 Å to 1,500 Å from the main surface of the silicon substrate.

4. The method according to claim 2, comprising laser thermal annealing by impinging a laser light beam at a radiant fluence of 0.2 to 0.8 joules/cm$^2$ for 1 to 10 nanoseconds.

5. The method according to claim 2, comprising forming the sidewall spacers of silicon nitride.

6. The method according to claim 2, comprising forming the deep source/drain regions having an activated impurity concentration of $1\times10^{20}$ to $1\times10^{21}$ atoms/cm$^3$ at the interface between the NiSi layer and the silicon substrate.

7. The method according to claim 6, wherein the deep source/drain regions have an impurity concentration in a lower portion thereof which is less than that at the interface.

* * * * *